United States Patent
Sato et al.

(10) Patent No.: US 9,663,862 B2
(45) Date of Patent: May 30, 2017

(54) METHOD OF SMOOTHING SOLID SURFACE WITH GAS CLUSTER ION BEAM AND SOLID SURFACE SMOOTHING APPARATUS

(71) Applicant: JAPAN AVIATION ELECTRONICS INDUSTRY, LIMITED, Shibuya-ku, Tokyo (JP)

(72) Inventors: Akinobu Sato, Tokyo (JP); Akiko Suzuki, Tokyo (JP); Emmanuel Bourelle, Montmirail (FR); Jiro Matsuo, Kyoto (JP); Toshio Seki, Kyoto (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 14/932,038

(22) Filed: Nov. 4, 2015

(65) Prior Publication Data

US 2016/0068970 A1     Mar. 10, 2016

Related U.S. Application Data

(62) Division of application No. 14/136,329, filed on Dec. 20, 2013, now abandoned, which is a division of
(Continued)

(30) Foreign Application Priority Data

Oct. 30, 2006    (JP) ................................. 2006-293686

(51) Int. Cl.
    *H01J 27/00*       (2006.01)
    *C23F 4/00*        (2006.01)
    (Continued)

(52) U.S. Cl.
    CPC ............. *C23F 4/00* (2013.01); *H01J 27/026* (2013.01); *H01J 37/20* (2013.01);
    (Continued)

(58) Field of Classification Search
    CPC .. H01J 37/317; H01J 37/20; H01J 2237/0812; H01J 27/026; H01J 37/3056;
    (Continued)

(56) References Cited

U.S. PATENT DOCUMENTS

| | | |
|---|---|---|
| 4,152,478 A | 5/1979 | Takagi |
| 4,740,267 A | 4/1988 | Knauer et al. |

(Continued)

FOREIGN PATENT DOCUMENTS

| | | |
|---|---|---|
| EP | 1670048 | 6/2006 |
| JP | 05/102083 | 4/1993 |

(Continued)

OTHER PUBLICATIONS

Teruyuki Kitagawa, Optimum Incidence Angel of Ar Cluster Ion Beam for Superhard Carbon Film Deposition, Japanese Journal of Applied Physics, vol. 43, No. 6B, 2004, pp. 3955-3958.

(Continued)

*Primary Examiner* — Brooke Purinton
(74) *Attorney, Agent, or Firm* — Greenblum & Bernstein, P.L.C.

(57) ABSTRACT

A method of smoothing a solid surface with a gas cluster ion beam includes irradiating the solid surface with the gas cluster ion beam. The irradiating includes, when scratches which can be likened to a line-and-space pattern structure with widths and heights on the order of a submicrometer to micrometer are present on the solid surface, a process of emitting the gas cluster ion beam so as to expose substances, which remain on side-walls of the scratches due to lateral transferal caused by collisions with gas clusters, to other gas (Continued)

clusters, and the gas cluster ion beam diverges non-concentrically and/or non-uniformly.

3 Claims, 7 Drawing Sheets

Related U.S. Application Data application No. 12/312,265, filed as application No. PCT/JP2007/071102 on Oct. 30, 2007, now abandoned.

(51) Int. Cl.
*H01J 27/02* (2006.01)
*H01J 37/20* (2006.01)
*H01J 37/305* (2006.01)
*H01J 37/317* (2006.01)
*H01L 21/3065* (2006.01)

(52) U.S. Cl.
CPC ........ *H01J 37/3053* (2013.01); *H01J 37/317* (2013.01); *H01J 2237/20207* (2013.01); *H01J 2237/20214* (2013.01); *H01L 21/3065* (2013.01)

(58) Field of Classification Search
CPC ......... H01J 2237/20214; H01J 37/3005; H01J 2237/3174; H01J 2237/202
See application file for complete search history.

(56) References Cited

U.S. PATENT DOCUMENTS

| | | | |
|---|---|---|---|
| 5,118,942 A | 6/1992 | Hamade | |
| 5,459,326 A | 10/1995 | Yamada | |
| 5,483,077 A | 1/1996 | Glavish | |
| 5,525,158 A | 6/1996 | Tsukazaki | |
| 5,683,547 A * | 11/1997 | Azuma | H01J 37/3056 216/37 |
| 5,986,264 A | 11/1999 | Grunewald | |
| 6,153,067 A | 11/2000 | Maishev et al. | |
| 6,207,282 B1 | 3/2001 | Deguchi et al. | |
| 6,214,183 B1 | 4/2001 | Maishev et al. | |
| 6,537,606 B2 | 3/2003 | Allen et al. | |
| 6,613,240 B2 | 9/2003 | Skinner et al. | |
| 6,812,147 B2 * | 11/2004 | Skinner | H01L 21/02063 257/E21.226 |
| 7,022,586 B2 | 4/2006 | Maleville et al. | |
| 7,064,927 B2 | 6/2006 | Erickson et al. | |
| 7,115,511 B2 | 10/2006 | Hautala | |
| 7,176,454 B2 | 2/2007 | Hayden et al. | |
| 7,316,933 B2 | 1/2008 | Kersch et al. | |
| 7,420,189 B2 | 9/2008 | Imamura et al. | |
| 7,504,185 B2 | 3/2009 | Ikuta et al. | |
| 7,563,379 B2 | 7/2009 | Suzuki et al. | |
| 7,626,183 B2 | 12/2009 | Wagner et al. | |
| 7,696,495 B2 | 4/2010 | Mack et al. | |
| 8,691,700 B2 * | 4/2014 | Hautala | H01L 21/31122 216/66 |
| 2002/0016079 A1 | 2/2002 | Dykstra et al. | |
| 2003/0109092 A1 | 6/2003 | Choi et al. | |
| 2004/0031936 A1 | 2/2004 | Oi et al. | |
| 2004/0104682 A1 | 6/2004 | Horsky et al. | |
| 2004/0137733 A1 | 7/2004 | Hautala | |
| 2005/0133736 A1 | 6/2005 | Chen et al. | |
| 2005/0155951 A1 * | 7/2005 | Suzuki | B81C 1/00531 216/66 |
| 2005/0173656 A1 | 8/2005 | Kaim et al. | |
| 2005/0250344 A1 | 11/2005 | Kersch et al. | |
| 2005/0253089 A1 | 11/2005 | Maeno et al. | |
| 2006/0105570 A1 * | 5/2006 | Hautala | C23C 14/0605 438/687 |
| 2006/0108531 A1 | 5/2006 | Lo | |
| 2006/0145087 A1 | 7/2006 | Parker | |
| 2006/0208203 A1 | 9/2006 | Gupta et al. | |
| 2006/0238133 A1 | 10/2006 | Horsky et al. | |
| 2006/0278611 A1 | 12/2006 | Sato et al. | |
| 2007/0077499 A1 | 4/2007 | Ikuta et al. | |
| 2007/0176115 A1 | 8/2007 | Horsky et al. | |
| 2007/0227879 A1 | 10/2007 | Imamura et al. | |
| 2008/0078952 A1 | 4/2008 | Gupta et al. | |
| 2008/0128621 A1 | 6/2008 | Berry | |
| 2010/0207041 A1 | 8/2010 | Sato et al. | |

FOREIGN PATENT DOCUMENTS

| | | |
|---|---|---|
| JP | 07-058089 | 3/1995 |
| JP | 08-120470 | 5/1996 |
| JP | 08-293483 | 11/1996 |
| JP | 2003-505867 | 2/2003 |
| JP | 2003-188156 | 7/2003 |
| JP | 2003-533868 | 11/2003 |
| WO | 01/06538 | 1/2001 |
| WO | 01/48794 | 7/2001 |
| WO | 2005/031838 | 4/2005 |

OTHER PUBLICATIONS

Allen Kirkpatrick, Gas cluster ion beam applications and equipment, Nuclear Instruments and Methods in Physics Research Section B: Beam Interactions with Materials and Atoms, vol. 206, May 2003, pp. 830-837, ISSN 0168-583X, 10.1016/S0168-583X(03)00858-9.
Isao Yamada et al., Materials processing by gas cluster ion beams, Materials Science and Engineering: R: Reports, vol. 34, Issue 6, Oct. 30, 2001, pp. 231-295, ISSN 0927-796, 10.1016/50927-796X(01)00034-1.
Search report from E.P.O., mail date is Apr. 22, 2014.
E.P.O. Summons to Attend Oral Proceedings, mail date is Apr. 23, 2015.
Japan Office action, mail date is Mar. 4, 2014, along with an english translation thereof.
Toyoda, N. et al., "Ultra-Smooth Surface Preparation Using Gas Cluster Ion Beams," Jpn. J. Appl. Phys. vol. 41 (2002) Pt. 1, No. 6B, pp. 4287-4290.
Yamada, I. et al., "Materials processing by gas cluster ion beams," Materials Science and Engineering R 34 (2001), pp. 231-295.
Toyoda et al., "Nano structure formation by gas cluster ion beam irration at oblique incidence", in Nuclear Instruments and Methods in Physics Research B, vol. 232 (2005), Apr. 28, 2005, pp. 212-216.
E.P.O. Office action, mail date is Sep. 24, 2013.
Office Action issued Dec. 6, 2011 by the Japanese Patent Office for counterpart foreign patent application JP 2008-54131.
First Office Action for corresponding South Korean patent application No. 10-2009-7007058 issued Dec. 15, 2010.
Office Action issued Apr. 14, 2010 for corresponding Chinese patent application No. 2007-80040778.3.
Extended European Search Report issued May 26, 2010 for corresponding European patent application No. 07 830 836.8.

* cited by examiner

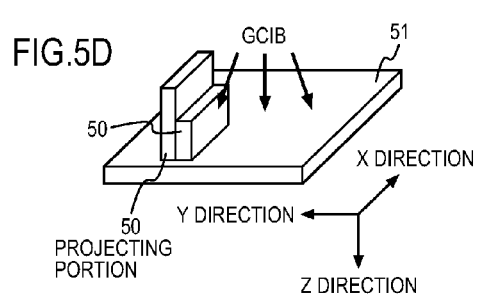
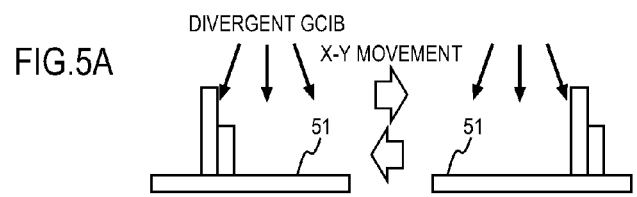
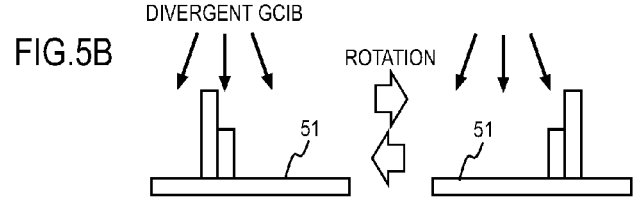
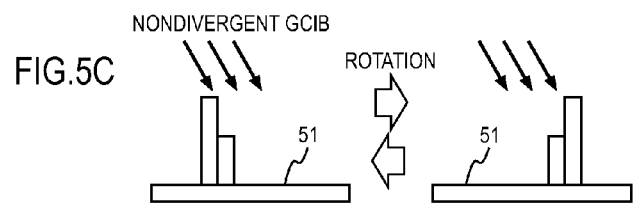

METHOD OF SMOOTHING SOLID SURFACE WITH GAS CLUSTER ION BEAM AND SOLID SURFACE SMOOTHING APPARATUS

The present application is a divisional application of co-pending U.S. application Ser. No. 14/136,329, filed Dec. 20, 2013, which is a divisional application of U.S. application Ser. No. 12/312,265, filed Oct. 21, 2009, now abandoned, which is a U.S. National Stage. Application of International Application No. PCT/JP2007/071102, filed Oct. 30, 2007, all the contents of which are expressly incorporated by reference herein in their entirety.

TECHNICAL FIELD

The present invention relates to solid surface smoothing methods using gas cluster ion beam irradiation and to apparatuses therefor.

BACKGROUND ART

A variety of gas-phase reaction methods have been developed for the purpose of smoothing surfaces of electronic devices and the like and have been put to practical use. For example, a substrate surface smoothing method disclosed in Patent literature 1 smoothes a substrate surface by sputtering using monatomic or monomolecular ions of Ar (argon) gas directed onto the substrate surface at a low angle.

Recently, solid surface smoothing methods using a gas cluster ion beam have been attracting attention because they can reduce surface roughness greatly without damaging the surface badly. For example, Patent literature 2 discloses a method of reducing surface roughness by irradiating a solid surface with a gas cluster ion beam. In this method, gas cluster ions directed onto the workpiece (solid) dissociate when they collide with the workpiece. In this process, multibody collisions occur between atoms or molecules forming the cluster and atoms or molecules forming the workpiece, causing noticeable motion in a lateral direction with respect to the workpiece surface (solid surface). As a result, the workpiece surface is cut laterally. This phenomenon is called lateral sputtering. The motion of particles in a lateral direction with respect to the workpiece surface mainly cuts projecting portions from the surface, performing ultraprecise polishing to produce a smooth surface at the atomic level.

In the gas cluster ion beam, an ion has a lower energy than that in normal ion etching. In other words, a single atom or molecule forming the cluster has a lower energy. This enables ultraprecise polishing as needed, without damaging the workpiece surface. One advantage of solid surface smoothing using a gas cluster ion beam is that the damage to the workpiece surface is less than that caused by ion etching, which is disclosed in Patent literature 1.

In solid surface smoothing using a gas cluster ion beam, it is generally recognized that the workpiece surface should be irradiated with the cluster ion beam at approximately right angles to the workpiece surface. This angle makes it possible to make maximum use of the effect of surface smoothing by lateral sputtering described above.

Patent literature 2 discloses that a curved surface or the like may be irradiated in an oblique direction, depending on the surface condition, but the effect of such oblique irradiation is not mentioned. Therefore, Patent literature 2 implies that approximately perpendicular irradiation of the solid surface is the most efficient for surface smoothing.

Patent literature 3 discloses another example of solid surface smoothing by using a gas cluster ion beam. However, Patent literature 3 does not describe the relationship between surface smoothing and the angle formed by the gas cluster ion beam and the solid surface. Since the description indicates that the lateral sputtering effect is used, it is inferred that, like Patent literature 2, Patent literature 3 shows data for perpendicular irradiation.

Non-patent literature 1 also includes a report of solid surface smoothing by gas cluster ion beam irradiation. In that literature, Toyoda and others report that surface roughness is reduced by irradiating the surface of materials such as Cu, SiC, and GaN with Ar cluster ions. The surface was irradiated with the gas cluster ion beam at approximately right angles.

Non-patent literature 2 describes variations in the roughness of a solid surface when the solid surface is irradiated with a gas cluster ion beam at a variety of irradiation angles. When the solid surface is irradiated at right angles, the irradiation angle is expressed as 90 degrees (the symbol ° will be used hereafter to express an angle). When the surface is irradiated laterally, the irradiation angle is expressed as 0°. The literature discloses that the sputtering rate, which indicates a speed at which the surface is etched, is maximized by perpendicular irradiation and that the etching rate decreases as the irradiation angle decreases. The relationship between surface roughness and irradiation angle was observed through experiments at different irradiation angles of 90°, 75°, 60°, 45°, and 30°. According to the literature, the surface roughness increased with a decrease in irradiation angle. No experiments were made at irradiation angles below 30°. It may have been thought that such experiments would be useless.

It was recently found that the roughness of a solid surface decreased greatly by reducing the angle of gas cluster ion beam irradiation with respect to the solid surface to below 30° (refer to Patent literature 4). This technology uses an oblique irradiation effect, and the smoothing mechanism differs from that in the conventional lateral sputtering. Patent literature 4 describes the use of a plurality of irradiation angles in irradiation of the solid surface with the gas cluster ion beam. The irradiation is performed at different angles in succession.

Patent literature 1: Japanese Patent Application Laid Open No. H7-58089

Patent literature 2: Japanese Patent Application Laid Open No. H8-120470

Patent literature 3: Japanese Patent Application Laid Open No. H8-293483

Patent literature 4: WO2005/031838

Non-patent literature 1: Jpn. J. Appl. Phys., Vol. 41 (2002), pp. 4287-4290

Non-patent literature 2: Materials Science and Engineering R 34 (2001), pp. 231-295

DISCLOSURE OF THE INVENTION

Problems to be Solved by the Invention

In the smoothing method disclosed in Patent literature 1, sputtering is performed by emitting an ion beam of Ar (argon) gas or the like, and projecting portions are cut off from the solid surface with priority. Although smoothing is performed to a certain level, the irradiation energy must be kept below 100 eV or so, in order to suppress damage to the solid surface. In that case, an extremely small ion current cannot provide a practical sputtering rate. Moreover, the smoothing method disclosed in Patent literature 1 has a serious problem in that smoothing is almost impossible if the solid surface has a scratch or other surface roughness having a submicrometer (0.1 μm to 1 μm) to micrometer (μm) width and height.

The smoothing methods based on lateral sputtering using approximately perpendicular gas cluster ion beam irradiation, as disclosed in Patent literatures 2, 3, and 4 and Non-patent literatures 1 and 2, also have a serious problem in that smoothing is almost impossible if the solid surface has a scratch or similar surface roughness having a submicromter to micrometer width and height.

In view of the problems described above, an object of the present invention is to provide a solid surface smoothing method and apparatus that can reduce surface roughness like a scratch in solid surface by gas cluster ion beam irradiation.

Means to Solve the Problems

In order to solve the problems described above, a gas-cluster-ion-beam solid surface smoothing method of the present invention includes an irradiation step of irradiating a solid surface with a gas cluster ion beam. In the gas-cluster-ion-beam solid surface smoothing method, the irradiation step includes a process of causing clusters from a plurality of directions to collide with at least an area (spot) irradiated with the gas cluster ion beam in the solid surface. Upon collision of clusters coming from a plurality of directions with the spot, the individual clusters advance sputtering in various directions.

The collision of clusters coming from a plurality of directions with the spot may be made by emitting a gas cluster ion beam which releases clusters in diverging directions with respect to the beam center. It is preferred that the gas cluster ion beam be a gas cluster ion beam randomly diverging with an angle of at least 2° with respect to the beam center.

By emitting the gas cluster ion beam releasing clusters in diverging directions onto the solid surface, it becomes easier for the clusters to collide with the spot from a plurality of directions.

The collision of clusters coming from a plurality of directions with the spot may also be made by emitting the gas cluster ion beam while moving the solid.

By directing the gas cluster ion beam while the solid is being moved, clusters can collide with the spot from more directions.

The collision of clusters coming from a plurality of directions with the spot may be made by emitting the gas cluster ion beam while rotating the solid.

By emitting the gas cluster ion beam while the solid is being rotated, clusters can collide with the spot from more directions.

The collision of clusters from a plurality of directions with the spot may be made by emitting the gas cluster ion beam while varying the irradiation angle formed by the gas cluster ion beam and the normal to the solid surface.

By emitting the gas cluster ion beam while varying the irradiation angle formed by the gas cluster ion beam and the normal to the solid surface, additional smoothing effects by lateral sputtering or oblique irradiation are produced.

The collision of clusters coming from a plurality of directions with the spot may be made by emitting a plurality of the gas cluster ion beams.

By emitting a plurality of the gas cluster ion beams, clusters can collide with the spot from more directions.

In order to solve the problems described above, a solid surface smoothing apparatus for smoothing a solid surface with a gas cluster ion beam according to the present invention includes beam setup means which can set up the gas cluster ion beam to diverge randomly with an angle of at least 2° with respect to the beam center, gas-cluster-ion-beam emission means which emits the gas cluster ion beam onto the solid surface, and means which can move the solid and/or means which can rotate the solid. A plurality of the gas-cluster-ion-beam emission means may be included.

Effects of the Invention

According to the present invention, by colliding clusters with the spot, which is a gas cluster ion beam irradiation area, from a plurality of directions, sputtering proceeds in various directions with the individual clusters. In this process, a scratch or similar surface roughness in the solid surface can be reduced.

BRIEF DESCRIPTION OF THE DRAWINGS

FIG. 5A is a diagram illustrating that, when irradiation of a divergent GCIB is combined with X-Y scanning of the target, clusters coming from a plurality of directions collide with a target surface substantially simultaneously;

FIG. 5B is a diagram illustrating that, when irradiation of a divergent GCIB is combined with the rotation of the target, clusters coming from a plurality of directions collide with the target surface substantially simultaneously;

FIG. 5C is a diagram illustrating that, when oblique irradiation of a nondivergent (or less divergent) GCIB is combined with the rotation of the target or the like, clusters coming from a plurality of directions collide with the target surface substantially simultaneously;

FIG. 5D is a diagram showing the target surface; and

BEST MODES FOR CARRYING OUT THE INVENTION

Prior to the description of an embodiment, the principle of smoothing used in the present invention will be summarized.

Figure 1A:
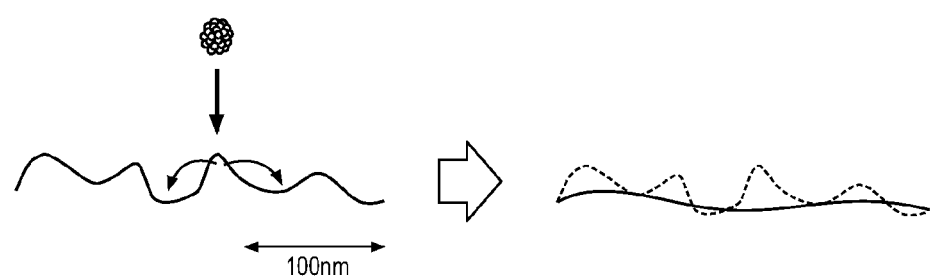
FIG. 1A is a diagram illustrating how a solid surface is smoothed by lateral sputtering.

The mechanism of surface smoothing using a gas cluster ion beam (GCIB) was conventionally thought to be a phenomenon in which a solid surface subjected to GCIB irradiation undergoes lateral sputtering, transferring the substance of the solid surface in a lateral direction (a direction nearly parallel to the solid surface) from a projection to a depression, so that the depressed portion is filled with the cut portions of the projecting portion (refer to Patent literature 2, for instance). FIG. 1A is a diagram illustrating how a solid surface is smoothed out by lateral sputtering.

Figure 1B:
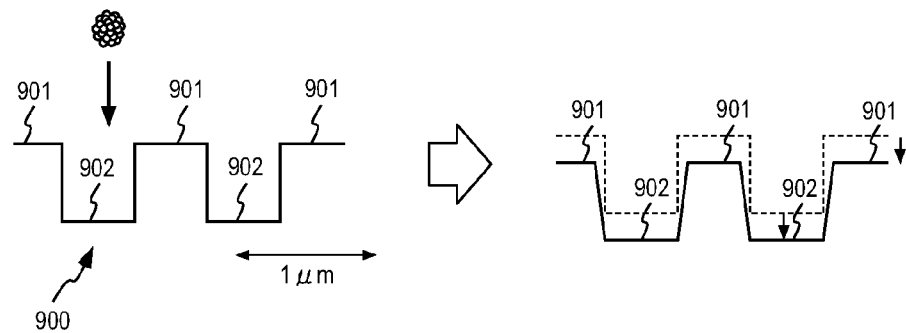
FIG. 1B is a diagram illustrating that a solid surface having a depression like a scratch is not smoothed out by lateral sputtering.

The inventors observed smoothing of solid surfaces having a scratch or the like with a submicrometer to micrometer width and height. In the observation, GCIB irradiation was performed by likening a line-and-space pattern structure 900 to a scratch. Through the observation, it was found that a surface having a scratch was hardly smoothed by the conventional lateral sputtering. This state is illustrated in FIG. 1B. The reason for failure of smoothing is that both the top of the line denoted by a reference numeral 901 (a part around the top of a projecting portion of the line-and-space pattern structure, corresponding to a projection) and the bottom of the space denoted by a reference numeral 902 (a part around the bottom of a grooved portion in the line-and-space pattern structure, corresponding to a depression) were etched, making little difference in height. In other words, because etching proceeds analogously to the original shape of the surface, little smoothing occurred.

Figure 2A:
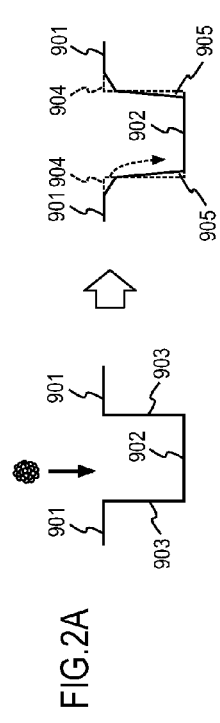
FIG. 2A is a diagram illustrating substance transfer caused by GCIB irradiation, near the top of a line in a line-and-space pattern structure.
Figure 2B:
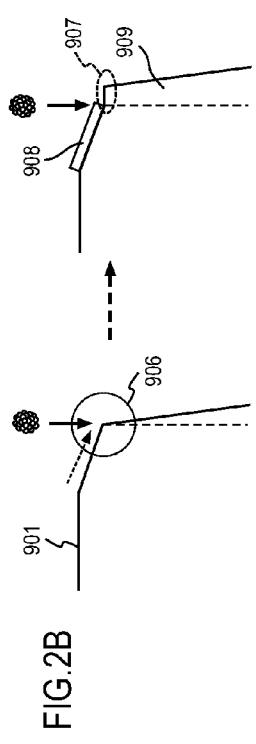
FIG. 2B is a diagram illustrating substance transfer at an edge of the line.

Substance transfer by GCIB irradiation near the top of the line (a part of a side wall 903 in the depth direction of the line, close to the top 901 of the line and far from the bottom 902 of the space) in the line-and-space pattern structure 900 was closely observed. FIGS. 2A to 2D are diagrams showing the states. As shown in FIG. 2A, the GCIB irradiation caused a substance 904 around the top of the line to move along the side wall 903 of the line to the bottom of the side wall of the line denoted by a reference numeral 905 (a part of the side wall 903 in the depth direction of the line, far from the top 901 of the line). The observed transfer is indicated by a broken arrow in the right diagram in FIG. 2A. A shoulder-like part denoted by a reference numeral 907 (enclosed with a broken line in FIG. 2B) was observed on the edge of the line (near the border between the top 901 of the line and the side wall 903 of the line). The right diagram in FIG. 2B is an enlarged view of a circled part 906 in the left diagram of FIG. 2B. In the left diagram in FIG. 2B, a broken arrow represents the lateral movement of a substance near the top of the line. In the right diagram in FIG. 2B, a reference numeral 908 denotes a substance near the top of the line, and a reference numeral 909 denotes a substance moved along the side wall 903 of the line. In this state, the substance near the top of the line does not move to a wide area across the bottom of the space. Therefore, both the top of the line and the bottom of the space are etched, making little difference in height.

Based on these findings, a variety of experiments were conducted under different GCIB irradiation conditions, to observe the transfer of a substance around the top of the line. As a result, it was found that the conventional GCIB irradiation in one direction allows the substance to stay on the side wall of the line, as shown in FIG. 2C, and does not advance smoothing.

Figure 2C:
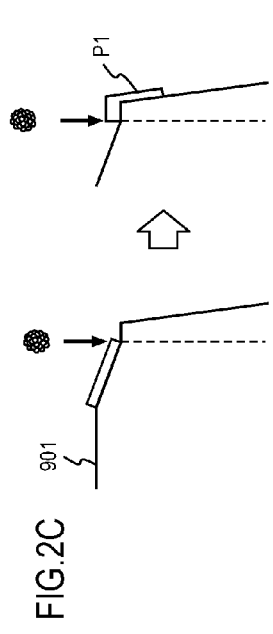
FIG. 2C is a diagram illustrating that a substance staying on the side wall around the edge of the line hinders the progress of smoothing in GCIB irradiation in one direction.

The failure occurs because, in perpendicular irradiation, the side wall 903 of the line is exposed to less GCIB irradiation than the top 901 of the line or the bottom 902 of the space, making the substance there less likely to move (see the part denoted by reference symbol P1 in FIG. 2C). In oblique irradiation, the cluster readily collides with the side wall of the line facing the GCIB irradiation, whereas the cluster hardly collides with the opposite side wall of the line. Even if the substance staying on the side wall 903 of the line moves, the movement would be limited to an area near the edge of the space (area around the boundary between the bottom 902 of the space and the side wall 903 of the line), hardly advancing the smoothing.

Figure 2D:
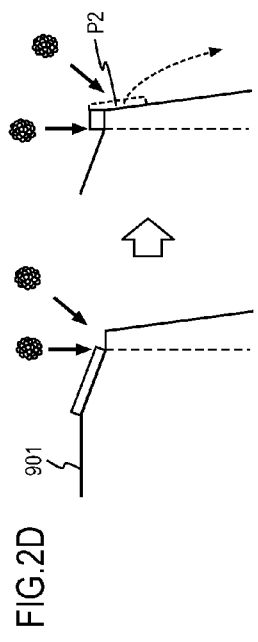
FIG. 2D is a diagram illustrating that GCIB irradiation from a plurality of directions does not allow a substance to stay on the side wall of the line and advances smoothing.

In contrast, when the GCIB was directed from a plurality of directions, the substance did not stay on the side wall 903 of the line, and smoothing proceeded as shown in FIG. 2D.

Clusters coming from the plurality of directions collide with the substance (P1) remaining on the side wall 903 of the line, causing sputtering to proceed in various directions. This makes the substance (P1) easier to move to the bottom 902 of the space, allowing substance transfer over a wide range at the bottom 902 of the space (see the part denoted by reference symbol P2 in FIG. 2D). This phenomenon was newly discovered through the present invention.

The inventors have found the following: To reduce (smooth out) a scratch or similar surface roughness by GCIB irradiation, it is important to expose a substance in the solid surface transferred laterally by a collision with a cluster to another cluster (or to repeat collision). This should be achieved by causing clusters coming from a plurality of directions to collide with the spot serving as a GCIB irradiation area. To promote substance transfer over a wider range for the purpose of achieving maximum smoothing of the solid surface, time intervals between cluster collisions should be minimized so that the clusters collide almost at the same time.

Clusters coming from a plurality of directions should be collided with the area (spot) irradiated by the GCIB. Preferably, roughly simultaneous cluster collisions should be caused to promote smoothing of the solid surface.

An embodiment of the present invention and examples will now be described. The structure and functions of a solid surface smoothing apparatus 100 that implements the solid surface smoothing method of the present invention will be described first with reference to FIG. 3.

Figure 3:
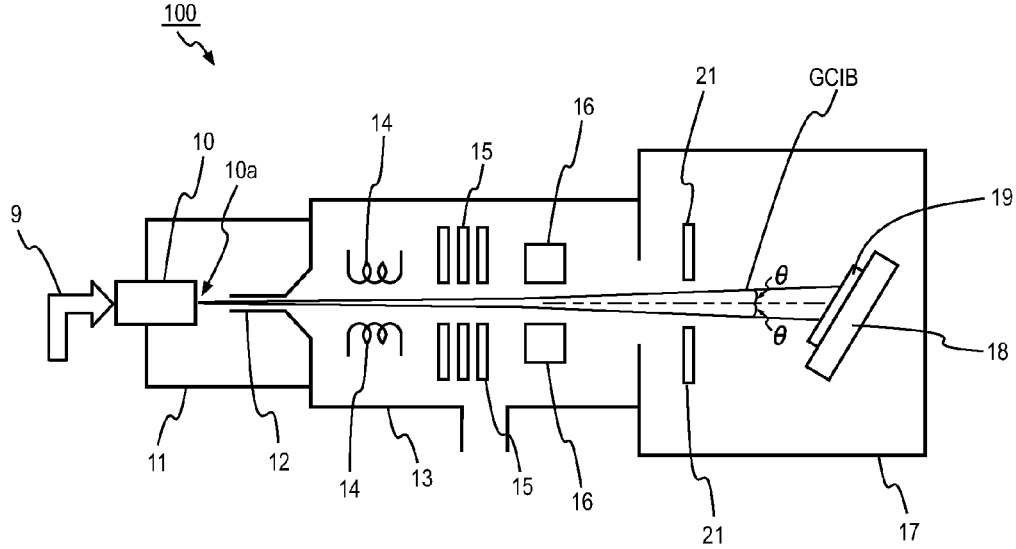
FIG. 3 is a diagram showing an example structure of a solid surface smoothing apparatus 100 of an embodiment of the present invention.

GCIB emission means is structured as follows. Source gas 9 is supplied via a nozzle 10 into a vacuum cluster generation chamber 11. Gas molecules of the source gas 9 aggregate into clusters in the cluster generation chamber 11. The cluster size is determined by the particle size distribution based on the pressure and temperature of gas at a nozzle outlet 10a and the size and shape of the nozzle 10. The clusters generated in the cluster generation chamber 11 are guided into an ionization chamber 13 by a skimmer 12 as a gas cluster beam. By increasing the skimmer diameter of the skimmer 12, a relatively random mixture of beams having different angles can be produced, instead of GCIBs diverging concentrically and uniformly. In the ionization chamber 13, an ionizer 14 emits an electron beam of thermal electrons, for example, to ionize the neutral clusters. The ionized gas cluster beam (GCIB) is accelerated by an accelerating electrode 15. In a conventional general GCIB emission apparatus, to produce a nondivergent GCIB, beams are converged into parallel beams by a magnetic-field convergence control unit 16 and directed to a ferromagnetic deflecting cluster size control unit using a permanent magnet. In the solid surface smoothing apparatus 100, however, the magnetic-field convergence control unit 16 does not converge the beams but diverges the beams. In other words, beam convergence is conducted under more moderate conditions than in general beam convergence. In FIG. 3, an angle θ of 2° or greater is preferred. The GCIB is symmetric with respect to the beam center in FIG. 3, but the GCIB may have an asymmetric spread. The GCIB then enters a sputtering chamber 17. On a target support 18 provided in the sputtering chamber 17, a target 19, which is a solid (such as a silicon substrate) to be irradiated with the GCIB, is fixed through a rotary disc 41. The GCIB entering the sputtering chamber 17 is narrowed to a predetermined beam diameter by an aperture 121 and directed onto the surface of the target 19. When the surface of the target 19 of an electrical insulator is smoothed, the GOB is neutralized by electron beam irradiation.

The solid surface smoothing apparatus 100 includes a first rotation mechanism that rotates the target 19. In the embodiment described here, the first rotation mechanism rotates the target 19 about an axis roughly parallel to the normal to the target surface. Because the main point of the present invention is to cause clusters to collide with the spot from a plurality of directions, the solid is not always rotated about the axis roughly parallel to the normal to the target surface. The solid may be rotated about any desired axis.

Figure 4A:
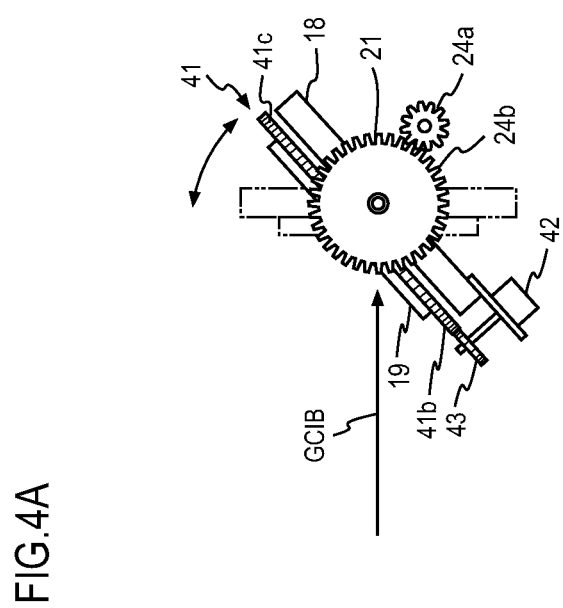
FIG. 4A is a side view showing a first rotation mechanism of the solid surface smoothing apparatus 100.
Figure 4B:
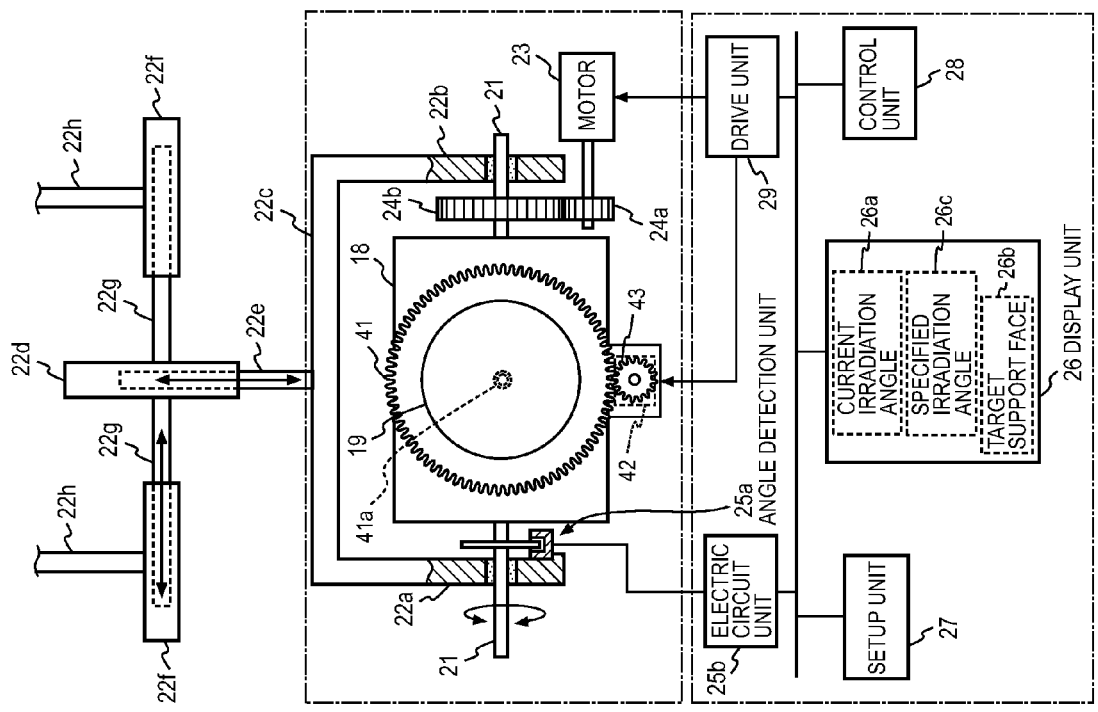
FIG. 4B is a plan view showing the first rotation mechanism, a second rotation mechanism, and a scan mechanism of the solid surface smoothing apparatus 100.

The first rotation mechanism is structured as follows, as shown in FIGS. 4A and 4B, for example. The target support 18 has a projecting shaft 41*a*, and the rotary disc 41 is mounted on the projecting shaft 41*a* to rotate on the center of the projecting shaft 41*a*. The rotary disc 41 has a flat part 41*b*, on which the target 19 is attached. The rotary disc 41 has a great number of teeth in its rim 41*c*, and the teeth engage with the teeth of a gear 43. The gear 43 rotates when driven by a motor 42, and the rotation is transferred to the rotary disc 41, consequently, rotating the target 19 attached to the rotary disc 41.

The solid surface smoothing apparatus 100 is also equipped with a tilting mechanism that can change the GCIB irradiation angle, as an irradiation angle setting means. In this embodiment, the tilting mechanism is implemented by a rotation mechanism that can change the irradiation angle continuously.

The solid surface smoothing apparatus 100 includes a second rotation mechanism, as shown in FIG. 4B, for example. A rotation shaft 21 is fixed to the target support 18, and the target support 18 can rotate on the center of the rotation shaft 21. The rotation shaft 21 is rotatably supported by stationary plates 22*a* and 22*b*. The rotation shaft 21 is fixed also to the center of a rotation axis of a gear 24*b*, and the gear 24*b* engages with a gear 24*a*. The gear 24*a* rotates when driven by a motor 23, and the rotation is transferred to the gear 24*b* and the rotation shaft 21, consequently rotating the target support 18. The rotation of the target support 18 is reflected in the irradiation angle. The stationary plate 22*a* is equipped with an angle detection unit 25*a* for detecting the angle of rotation of the target support 18, that is, the GCIB irradiation angle with reference to the solid surface of the target 19 attached to the target support 18, as a digital value, from the angle of rotation of the rotation shaft 21. The angle-of-rotation information detected by the angle detection unit 25*a* is processed by an electric circuit unit 25*b*, and the currently detected angle (irradiation angle) is displayed in a current angle area 26*a* of a display unit 26.

The solid surface smoothing apparatus 100 is also equipped with a scanning mechanism for changing the relative position of the target 19 with respect to the GCIB, such as an XY stage.

Suppose that the stationary plates 22*a* and 22*b* are fixed to and supported by a stationary-plate supporting member 22*c*. The stationary-plate supporting member 22*c* and a first actuator 22*d* are connected via a first rod 22*e*. The first actuator 22*d* can push and pull the first rod 22*e*, and this action can change the position of the target support 18. In the solid surface smoothing apparatus 100 shown in FIG. 4B, for example, the motion of the first actuator 22*d* can change the position of the target support 18 in up and down directions in the figure.

The first actuator 22*d* is fixed to and supported by a second rod 22*g*, and the first actuator 22*d* is connected to second actuators 22*f* through the second rod 22*g*. The second actuators 22*f* can push and pull the second rod 22*g*, and this action changes the position of the first actuator 22*d*. Consequently, the position of the target support 18 connected to the first actuator 22*d* via the first rod 22*e* and the other parts mentioned above can be changed. The direction in which the first rod 22*e* can move is nearly orthogonal to the direction in which the second rod 22*g* can move. The scanning mechanism like an XY stage is implemented as described above. In the solid surface smoothing apparatus 100 shown in FIG. 4B, for example, the motion of the second actuators 22*f* can change the position of the target support 18 in the left and right directions in the figure. Therefore, in combination with the motion of the first actuator 22*d*, the target support 18 can be moved up and down, and left and right in the figure.

By combining divergent GCIB irradiation and X-Y scanning of the target, clusters coming from a plurality of directions (viewed from the target) can collide with a solid surface 51 of the target 19 substantially simultaneously (see FIG. 5A; as shown in FIG. 5D, a projecting portion 50 provided in the solid surface 51 is analogous to surface roughness in the solid surface 51). FIG. 5A shows X-Y scanning in a plane roughly parallel to the solid surface 51. This does not mean that the scanning is limited to the X-Y scanning in a plane roughly parallel to the solid surface 51, however. If the target support 18 is positioned to make perpendicular irradiation with respect to the center of the GCIB, the scanning mechanism described above implements X-Y scanning in a plane roughly parallel to the solid surface 51, as shown in FIG. 5A. If the target support 18 is positioned by the second rotation mechanism described above to make oblique irradiation with respect to the center of the GCIB, the scanning mechanism implements X-Y scanning in a plane which is not roughly parallel to the solid surface 51.

By combining divergent GCIB irradiation with the rotation of the target, clusters coming from a plurality of directions (viewed from the target) can collide with the solid surface 51 of the target 19 substantially simultaneously (see FIG. 5B). In addition, as shown in FIG. 5C, even if the GCIB is nondivergent (or less divergent), by irradiating the target 19 obliquely with the GCIB and rotating the target support 18, clusters coming from a plurality of directions (viewed from the target) can collide with the solid surface 51 of the target 19 substantially simultaneously.

In the embodiment described above, clusters coming from a plurality of directions can collide with the spot by appropriately combining the divergent or nondivergent GCIB, the movement by the first rotation mechanism, the movement by the second rotation mechanism, and the movement by the scanning mechanism.

Figure 6:
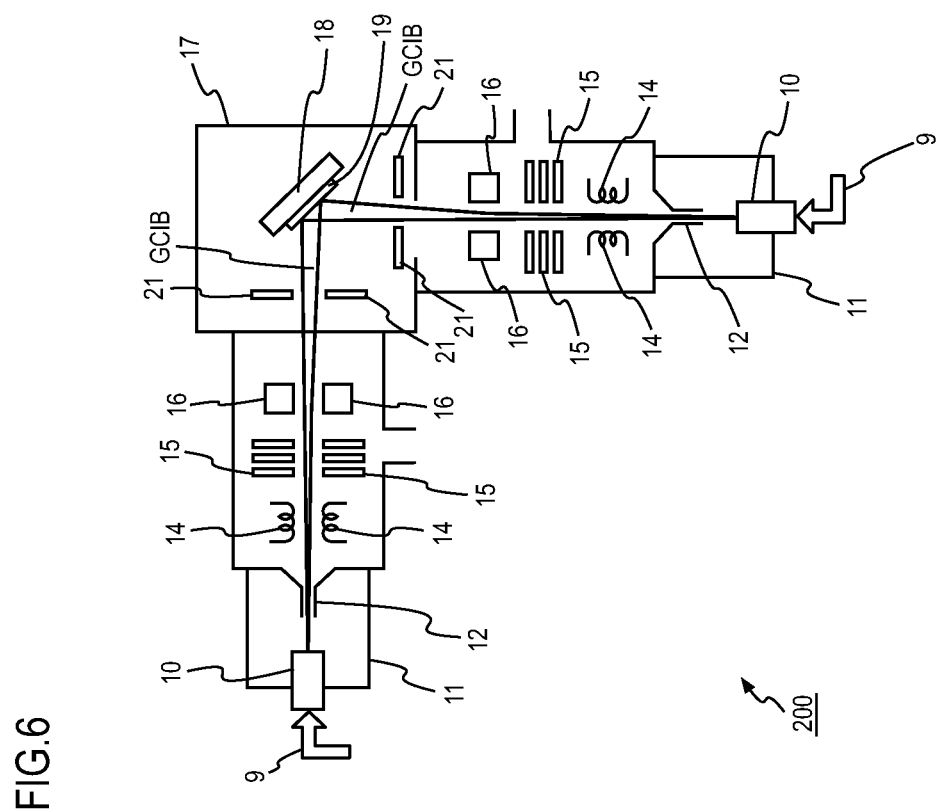
FIG. 6 is a diagram showing an example structure of a solid surface smoothing apparatus 200 equipped with a plurality of GCIB emission means.

Further, by emitting GCIBs from different directions from a plurality of GCIB emission means, as in a solid surface smoothing apparatus 200 shown in FIG. 6, clusters coming from a plurality of directions (viewed from the target) can collide with the surface of the target 19 substantially simultaneously. FIG. 6 shows an example with two GCIB emission means, but three or more GCIB emission means can also be provided as needed.

In the solid surface smoothing apparatus 100 shown in FIG. 4B, a setup unit 27 is used to set a face of the target support 18 as a reference plane and to input and specify desired conditions such as the etching amount, the material and etching rate of the target 19, the GCIB gas type, the accelerating energy, the irradiation angle, and the dose. Then, the target support face is displayed in a reference plane display area 26b of the display unit 26. An irradiation angle specified with reference to the plane is displayed in a specified angle area 26c.

A control unit 28 drives the motors 23 and 42 through a drive unit 29 to bring the current irradiation angle to a specified irradiation angle. The control unit 28 also controls the GCIB emission means to provide a specified dose of GCIB irradiation.

The control unit 28 has a CPU (central processing unit) or a microprocessor and performs the control operation and other operations as described above by executing information processing of programs required to execute solid surface smoothing, such as the display operation and motor drive operation described above.

The structure and mechanism of the solid surface smoothing apparatus of the present invention is not limited to those of the solid surface smoothing apparatus 100 or 200 described above, and modifications can be made within the scope of the present invention.

First Example

A mixture of $SF_6$ gas and He gas was used as a source gas, and an $SF_6$ gas cluster ion beam was generated. The $SF_6$ gas cluster ion beam was accelerated at 30 kV and directed onto the surface of the target 19. The irradiation angle was specified to bring the beam center of the GCIB (the center of propagation of the GCIB) roughly perpendicular to the solid surface.

The magnetic-field convergence control unit did not converge the GCIB and made the GCIB a randomly divergent beam with an angle of 2° at least with respect to the beam center of the GCIB. The angle θ shown in FIG. 3 was 2° or greater. A silicon substrate having a line-and-space pattern structure formed thereon beforehand by a semiconductor process was used as the target 19. More specifically, on the silicon substrate or SOI (silicon on insulator) substrate used as the target 19, a pattern structure was formed by the following method: An electron beam resist was applied on the substrate having a thermally-oxidized film, and a pattern structure was drawn on the resist by an electron beam drawing apparatus. After the resist was developed, the resist pattern was used as a mask, and the thermally-oxidized film was etched by a reactive ion etching (RIE) apparatus. The resist was then removed, and silicon was etched by the reactive ion etching (RIE) apparatus or an inductively coupled plasma reactive ion etching (ICP-RIE) apparatus, using the thermally-oxidized film as a hard mask. Then, the thermally-oxidized film was removed by an ashing apparatus.

The line-and-space pattern structure had a line-to-space ratio of 1:1. The lines had a height of about 1 μm and a width of about 1 μm, and the spaces also had a width of about 1 μm. The irradiation dose was $6*10^{15}$ ions/cm². The symbol * expresses a multiplication.

The mean surface roughness of the target surface was measured by using an atomic force microscope (AFM) before and after $SF_6$ gas cluster ion beam irradiation. The mean surface roughness Ra before $SF_6$ gas cluster ion beam irradiation was 0.46 μm, whereas the mean surface roughness Ra after $SF_6$ gas cluster ion beam irradiation was 0.21 μm.

Second Example

An experiment was conducted in the same manner as for the first example, except that the target 19 was scanned in the X-Y direction. The X-direction scanning rate was 1 Hz, and the Y-direction scanning rate was 0.02 Hz. The roughness of the target surface was measured by using an AFM after $SF_6$ gas cluster ion beam irradiation. The mean surface roughness Ra before $SF_6$ gas cluster ion beam irradiation was 0.46 μm, as in the first example, whereas the mean surface roughness Ra after $SF_6$ gas cluster ion beam irradiation was 0.13 μm.

Third Example

An experiment was conducted in the same manner as for the first example, except that the target 19 was rotated. Three rotation rates of 60 rpm, 180 rpm, and 600 rpm were used. The mean surface roughness of the target surface was measured by using an AFM after $SF_6$ gas cluster ion beam irradiation. The mean surface roughness Ra after $SF_6$ gas cluster ion beam irradiation was 0.18 μm, 0.12 μm, and 0.05 μm at a rotation rate of 60 rpm, 180 rpm, and 600 rpm, respectively.

Fourth Example

An experiment was conducted in the same manner as for the third example, except that the target was skewed with respect to the beam center of the GCIB, to make an angle between the target and the GCIB, that is, to perform oblique GCIB irradiation. The irradiation angle was 30°, with reference to the angle of perpendicular irradiation with respect to the target surface being defined as 0°. The mean surface roughness of the target surface was measured by using an AFM after $SF_6$ gas cluster ion beam irradiation. The mean surface roughness Ra after $SF_6$ gas cluster ion beam irradiation was 0.11 μm, 0.06 μm, and 0.02 μm at a rotation rate of 60 rpm, 180 rpm, and 600 rpm, respectively.

Fifth Example

An experiment was conducted in the same manner as for the first example, except that an $SiO_2$ film (silicon dioxide film) without a pattern formed on a silicon substrate was used as the target and that the irradiation dose was $2*10^{14}$ ions/cm² (the target was not rotated). The $SiO_2$ film was formed by sputtering, and the film thickness was 500 nm. The mean surface roughness Ra of the target surface was measured by using an AFM before and after $SF_6$ gas cluster ion beam irradiation. The mean surface roughness Ra before $SF_6$ gas cluster ion beam irradiation was 0.81 nm, whereas the mean surface roughness Ra after $SF_6$ gas cluster ion beam irradiation was 0.23 nm.

The results of experiments conducted in the examples show the effects of the present invention clearly. For further examination of the present invention, experiments for making a comparison with the prior art were conducted.

First Comparative Example

An experiment was conducted in the same manner as for the first example, except that a roughly parallel GCIB was used (the target was not rotated). The mean surface roughness Ra before $SF_6$ gas cluster ion beam irradiation was 0.46 μm, as in the first example, whereas the mean surface roughness Ra after $SF_6$ gas cluster ion beam irradiation was 0.42 μm.

Second Comparative Example

An experiment was conducted in the same manner as for the fifth example, except that a roughly parallel GCIB was used (the target was not rotated). The mean surface roughness Ra before $SF_6$ gas cluster ion beam irradiation was 0.81 nm, whereas the mean surface roughness Ra after $SF_6$ gas cluster ion beam irradiation was 0.36 nm.

A comparison between the first example and the first comparative example shows that the mean surface roughness of the target was reduced remarkably by using the divergent GCIB beam. There was just a single difference in the conditions between the two experiments: whether the GCIB was a divergent beam or a roughly parallel beam. The remarkable reduction in mean surface roughness of the target originated from the divergent GCIB beam. In other words, collisions with clusters coming from a plurality of directions advanced smoothing greatly.

It is understood from the first and second examples that the mean surface roughness was reduced further by changing the relative position of the target with respect to the GCIB through scanning of the target.

It is understood from the first to third examples that the rotation of the target was highly effective as a method of changing the relative position of the target surface with respect to the GCIB and that smoothing was promoted by increasing the target rotation rate.

It is understood from the third and fourth examples that smoothing proceeds further by oblique irradiation of the target with the GOB.

It is understood from the first and fourth examples that, in oblique irradiation, appropriate smoothing is performed by setting the GCIB irradiation angle to 2° or greater with respect to the normal to the solid surface.

A comparison between the fifth example and the second comparative example shows that a target having very small surface roughness with reference to the surface roughness, as indicated in the first example, can be smoothed out by using a divergent GCIB beam.

In view of the principle and function of the present invention, conditions, such as the type of the gas cluster to be used and the accelerating energy, are not limited, and the material of the target is not limited.

INDUSTRIAL APPLICABILITY

Since a scratch or similar surface roughness can be reduced from a solid surface, the present invention can be used to improve the precision of fine structures in semiconductor devices and optical devices and also to improve the precision of three-dimensional structures of dies used in fabrication of semiconductor devices and optical devices and the like.

What is claimed is:

1. A method of smoothing a solid surface with a single gas cluster ion beam emitted from a single emitter, the method comprising irradiating the solid surface with the single gas cluster ion beam,
  wherein:
    scratches shaped like a line-and-space pattern structure with widths and heights on an order of a submicrometer to micrometer are present on the solid surface;
    the single gas cluster ion beam diverges at least one of non-concentrically and non-uniformly; and
    the irradiating comprises:
      transferring to side-walls of the scratches, only materials of the solid surface by collisions with gas clusters included in the single gas cluster ion beam; and
      colliding other gas clusters, which are included in the single gas cluster ion beam, with the materials transferred through the transferring.

2. The method according to claim 1, wherein:
  the solid is moved back and forth in each of two directions which are normal to each other;
  the solid is moved back and forth at a rate of over 1 Hz in one direction of said two directions; and
  the solid is moved back and forth at a rate of over 0.02 Hz in another direction of said two directions.

3. The method according to claim 1, wherein:
  the solid is rotated at a rate of over 60 revolutions per minute, and
  irradiation of the single gas cluster ion beam is performed by emitting the single gas cluster ion beam with an irradiation angle between the single gas cluster ion beam and a normal to the solid surface irradiated with the single gas cluster ion beam being not equal to 0°.

* * * * *